US008658289B2

(12) United States Patent
Polcyn et al.

(10) Patent No.: US 8,658,289 B2
(45) Date of Patent: Feb. 25, 2014

(54) ELECTROMAGNETIC RADIATION SHIELDING DEVICE

(75) Inventors: Adam D. Polcyn, Pittsburgh, PA (US); John A. Winter, Pittsburgh, PA (US); Michael Buchanan, Cranberry Township, Butler County, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 0 days.

(21) Appl. No.: 12/268,656

(22) Filed: Nov. 11, 2008

(65) Prior Publication Data

US 2009/0197098 A1    Aug. 6, 2009

Related U.S. Application Data

(60) Provisional application No. 60/988,545, filed on Nov. 16, 2007.

(51) Int. Cl.
| | |
|---|---|
| *B32B 15/04* | (2006.01) |
| *B32B 15/08* | (2006.01) |
| *B32B 18/00* | (2006.01) |
| *B32B 7/12* | (2006.01) |
| *B32B 17/00* | (2006.01) |
| *B05D 1/00* | (2006.01) |
| *B05D 5/00* | (2006.01) |
| *B05D 5/06* | (2006.01) |
| *B05D 5/12* | (2006.01) |
| *E06B 3/66* | (2006.01) |
| *E04C 2/54* | (2006.01) |

(52) U.S. Cl.
USPC ........... 428/630; 428/673; 428/631; 428/632; 428/633; 428/640; 427/209; 427/162; 427/165; 427/167; 427/126.5; 52/786.1; 52/786.13; 156/327

(58) Field of Classification Search
USPC ......... 428/432, 450, 457, 673, 630, 631, 632, 428/633, 640, 426, 433, 434, 689, 702, 38
See application file for complete search history.

(56) References Cited

U.S. PATENT DOCUMENTS 3,762,988 A    10/1973  Clock et al. .................... 161/183
4,287,107 A *  9/1981  Hermann et al. ............. 524/318
(Continued)

FOREIGN PATENT DOCUMENTS

EP    1752426 A2    2/2007
GB    2302102 A     1/1997
(Continued)

OTHER PUBLICATIONS

PCT International Search Report dated Feb. 19, 2009 for International Application No. PCT/US2008/083152 filed Nov. 12, 2008.

*Primary Examiner* — Michael La Villa
(74) *Attorney, Agent, or Firm* — Andrew C. Siminerio

(57) ABSTRACT

An electromagnetic radiation shielding device includes a first ply having a No. 1 surface and a No. 2 surface and a second ply having a No. 3 surface and a No. 4 surface. The No. 2 surface of the first ply faces the No. 3 surface of the second ply. A first coating having three or more metallic layers is provided over at least a portion of one of the surfaces, such as over at least a portion of the No. 2 surface. A second coating having three or more metallic layers is provided over at least a portion of one or more of the other surfaces, such as over at least a portion of the No. 3 surface.

16 Claims, 2 Drawing Sheets

(56) References Cited

U.S. PATENT DOCUMENTS

| | | | |
|---|---|---|---|
| 4,379,040 A | 4/1983 | Gillery | 204/192 P |
| 4,504,109 A | 3/1985 | Taga et al. | 350/1.6 |
| 4,610,771 A | 9/1986 | Gillery | 204/192.1 |
| 4,716,086 A | 12/1987 | Gillery et al. | 428/630 |
| 4,746,347 A | 5/1988 | Sensi | 65/94 |
| 4,792,536 A | 12/1988 | Pecoraro et al. | 501/70 |
| 4,806,220 A | 2/1989 | Finley | 204/192.27 |
| 4,834,857 A | 5/1989 | Gillery | 204/192.27 |
| 4,861,669 A | 8/1989 | Gillery | 428/434 |
| 4,898,789 A | 2/1990 | Finley | 428/623 |
| 4,898,790 A | 2/1990 | Finley | 428/623 |
| 4,900,633 A | 2/1990 | Gillery | 428/432 |
| 4,902,580 A | 2/1990 | Gillery | 428/432 |
| 4,920,006 A | 4/1990 | Gillery | 428/432 |
| 4,938,857 A | 7/1990 | Gillery | 204/192.27 |
| 4,948,677 A | 8/1990 | Gillery | 428/623 |
| 4,952,423 A | 8/1990 | Hirata et al. | 427/109 |
| 5,028,759 A | 7/1991 | Finley | 219/203 |
| 5,030,593 A | 7/1991 | Heithoff | 501/72 |
| 5,030,594 A | 7/1991 | Heithoff | 501/72 |
| 5,059,295 A | 10/1991 | Finley | 204/192.27 |
| 5,240,886 A | 8/1993 | Gulotta et al. | 501/70 |
| 5,328,768 A | 7/1994 | Goodwin | 428/428 |
| 5,385,872 A | 1/1995 | Gulotta et al. | 501/71 |
| 5,393,593 A | 2/1995 | Gulotta et al. | 428/220 |
| 5,492,750 A | 2/1996 | Shumaker, Jr. et al. | 428/192 |
| 5,796,055 A | 8/1998 | Benson, Jr. et al. | 181/208 |
| 5,821,001 A | 10/1998 | Arbab et al. | 482/623 |
| 5,837,361 A | 11/1998 | Glaser et al. | 428/216 |
| 6,495,251 B1 | 12/2002 | Arbab et al. | 428/336 |
| 2003/0180547 A1 * | 9/2003 | Buhay et al. | 428/434 |
| 2005/0095449 A1 * | 5/2005 | Yanagisawa et al. | 428/689 |
| 2006/0093832 A1 * | 5/2006 | Ma | 428/426 |
| 2006/0280951 A1 | 12/2006 | Fleury et al. | 428/432 |
| 2007/0081227 A1 | 4/2007 | Hartig | 359/359 |
| 2007/0082219 A1 | 4/2007 | Fleury et al. | 428/656 |

FOREIGN PATENT DOCUMENTS

| | | | |
|---|---|---|---|
| WO | WO 00/37383 | * | 6/2000 |
| WO | WO2007/134015 A2 | | 11/2007 |

* cited by examiner

ELECTROMAGNETIC RADIATION SHIELDING DEVICE

CROSS REFERENCE TO RELATED APPLICATION

This application claims the benefit of U.S. Provisional Application No. 60/988,545, filed Nov. 16, 2007, herein incorporated by reference in its entirety.

BACKGROUND OF THE INVENTION

1. Field of the Invention

This invention relates generally to electromagnetic radiation shielding panels, such as windows or insulated glass units (IGU), useful for shielding against electromagnetic eavesdropping.

2. Technical Considerations

Electromagnetic radiation of various frequencies is produced from many sources, such as computer equipment, radio equipment, communications devices, telephones, and wireless networks, just to name a few. If this electromagnetic radiation were to be intercepted, it could be analyzed and the underlying data obtained. In order to prevent such interception, these devices can be kept in protected, e.g., shielded, rooms and great care is be taken to prevent the passage of such radiation outside of the protected area in which the equipment is located. This is particularly true in the case of confidential or classified information. While building walls typically do an adequate job of containing this radiation, conventional building windows are known to permit such radiation to escape.

In the past, it has been known to place metallic or polymeric foils over the windows to reduce radiation loss. While this does solve the problem of radiation loss, it reduces or eliminates the natural sunlight entering the building and prevents the building occupants from looking out of the windows. This can have a demoralizing effect on the occupants and makes the workplace itself less appealing.

Solar control coatings are known which affect the transmission of solar radiation through a window. These solar control coatings are typically highly transparent to visible light and are designed to reduce the passage of solar infrared energy into the building to prevent heat build-up in the building while still allowing the occupants to look out through the window. While these solar control coatings work well to control solar radiation entering the building through a window, they have, to date, not been adequate to prevent the escape of electromagnetic radiation from computers and other equipment out of the window.

Therefore, it would be desirable to provide a coating and/or coated article that could be used not only to provide solar control properties while maintaining a desirable visible light transmission but that also provide electromagnetic shielding properties.

SUMMARY OF THE INVENTION

An electromagnetic radiation shielding device comprises a first ply having a No. 1 surface and a No. 2 surface and a second ply having a No. 3 surface and a No. 4 surface. The No. 2 surface of the first ply faces the No. 3 surface of the second ply. A first coating having three or more metallic layers is provided over at least a portion of one of the surfaces, such as over at least a portion of the No. 1 or No. 2 surface. A second coating having three or more metallic layers is provided over at least a portion of one or more of the other surfaces, such as over at least a portion of the No. 3 or No. 4 surface. The first and/or second coatings have both solar control and electromagnetic shielding properties.

In one embodiment, the radiation shielding device is a laminated article in which the plies are secured together by a polymeric interlayer. In another embodiment, the radiation shielding device is in the form of an IGU, with the spaced plies held in a spacer assembly.

Another electromagnetic radiation shielding device comprises a first ply having a No. 1 surface and a No. 2 surface and a second ply spaced from the first ply and having a No. 3 surface and a No. 4 surface, with the No. 2 surface facing the No. 3 surface. A first coating is formed over at least a portion of the No. 2 surface and comprises at least three metallic layers. A second coating is formed over at least a portion of the No. 3 surface and comprises at least three metallic layers.

A method of shielding electromagnetic radiation comprises providing a first ply having a No. 1 surface and a No. 2 surface; forming a first coating over at least a portion of the No. 2 surface, the first coating comprising at least three metallic silver layers; providing a second ply spaced from the first ply and having a No. 3 surface and a No. 4 surface, with the No. 3 surface forming the No. 2 surface; and forming a second coating over at least a portion of the No. 3 surface, the second coating comprising at least three metallic silver layers.

BRIEF DESCRIPTION OF THE DRAWINGS

The invention will be described with reference to the following drawing figures wherein like reference numbers identify like parts throughout.

DESCRIPTION OF THE PREFERRED EMBODIMENTS

Figure 1:
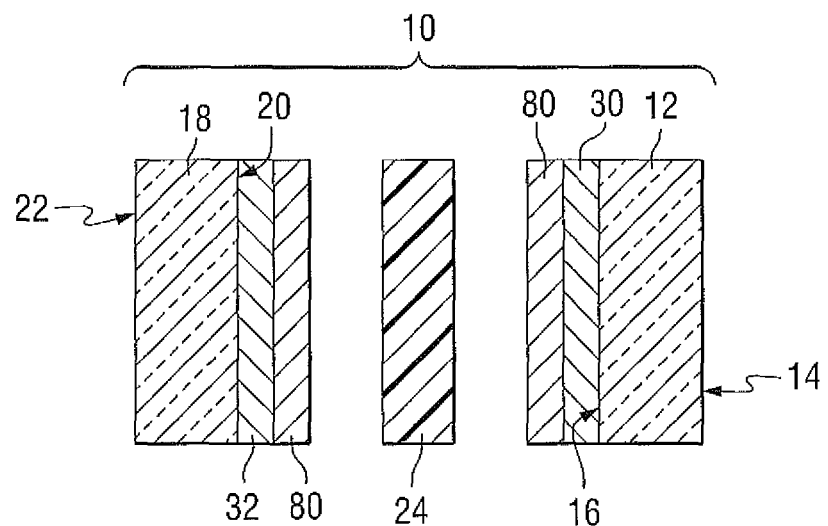
FIG. 1 is an expanded view (not to scale) of a laminated electromagnetic shielding device of the invention.

As used herein, spatial or directional terms, such as "left", "right", "inner", "outer", "above", "below", and the like, relate to the invention as it is shown in the drawing figures. However, it is to be understood that the invention can assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 3.3, 4.7 to 7.5, 5.5 to 10, and the like. Further, as used herein, the terms "formed over", "deposited over", or "provided over" mean formed, deposited, or provided on but not necessarily in direct contact with the surface. For example, a coating layer "formed over" a substrate does not preclude the presence of one or more other coating layers or films of the same or different composition located between the formed coating layer and the substrate. As used herein, the terms "polymer" or "polymeric" include oligomers, homopolymers, copolymers, and terpolymers, e.g., polymers formed from two or more types of monomers or polymers. The terms "visible region" or "visible light" refer to electromagnetic radiation having a wavelength in the range of 380 nm to 760 nm. The terms "infrared region" or "infrared radiation" refer to electromagnetic radiation having a wavelength in the range of greater than 760 nm to 100,000 nm. The terms "ultraviolet region" or "ultraviolet radiation" mean electromagnetic energy having a wavelength in the range of 300 nm to less than 380 nm. Additionally, all documents, such as but not limited to issued patents and patent applications, referred to herein are to be considered to be "incorporated by reference" in their entirety. The "visible transmission" and "dominant wavelength" values are those determined using the conventional methods. Those skilled in the art will understand that properties such as visible transmission and dominant wavelength can be calculated at an equivalent standard thickness, e.g., 5.5 mm, even though the actual thickness of a measured glass sample is different than the standard thickness.

For purposes of the following discussion, the invention will be discussed with reference to use as an electromagnetic radiation shielding device. As used herein, the term "electromagnetic shielding device" refers to any transparency, such as but not limited to vehicle transparencies or architectural transparencies, providing electromagnetic radiation shielding properties. However, it is to be understood that the invention could be practiced with transparencies in any desired field, such as but not limited to laminated or non-laminated residential and/or commercial windows, insulating glass units, and/or transparencies for land, air, space, above water and under water vehicles. Therefore, it is to be understood that the specifically disclosed exemplary embodiments are presented simply to explain the general concepts of the invention and that the invention is not limited to these specific exemplary embodiments. Additionally, while a typical "transparency" can have sufficient visible light transmission such that materials can be viewed through the transparency, in the practice of the invention the "transparency" need not be transparent to visible light but may be translucent or opaque (as described below).

A non-limiting electromagnetic radiation shielding device 10 incorporating features of the invention is illustrated in FIG. 1. The device 10 can have any desired visible light, infrared radiation, or ultraviolet radiation transmission and reflection. For example, the device 10 can have a visible light transmission of any desired amount, e.g., greater than 0% up to 100%. In one non-limiting embodiment, the visible light transmission at a reference wavelength of 550 nm can be up to 90%, such as up to 80%, such as up to 70%, such as up to 60%, such as up to 50%, such as up to 40%, such as up to 30%, such as up to 20%, such as in the range of 10% to 99%. In one specific non-limiting embodiment, the device 10 can have a visible light transmission of greater than 20%, such as greater than 30%, such as greater than 40%, such as greater than 50%, such as greater than 60%, such as greater than 70%, such as greater than 80%, such as greater than 90%.

Figure 3:
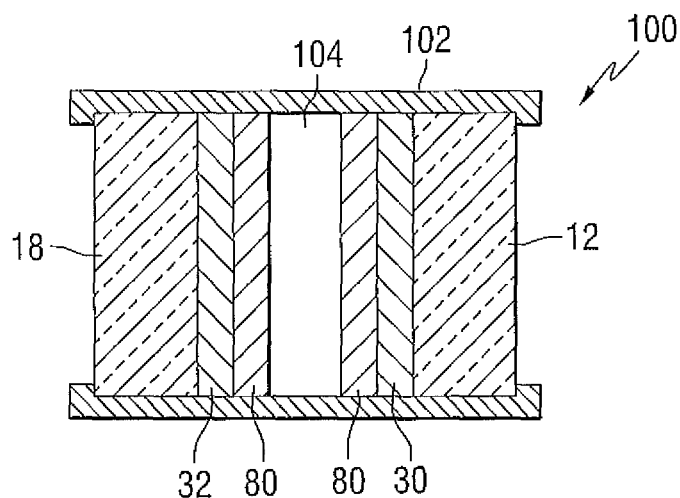
FIG. 3 is a cross-sectional view (not to scale) of another non-limiting embodiment of the invention.

The electromagnetic radiation shielding device 10 includes a first ply 12 with a first major surface 14, i.e., an outer major surface (No. 1 surface), and an opposed second or inner major surface 16 (No. 2 surface). For purpose of discussion, the first major surface 14 will be considered to face an exterior of a vehicle or building. The electromagnetic radiation shielding device 10 also includes a second ply 18 having a first major surface 20 (No. 3 surface) facing the No. 2 surface and a second major surface 22 (No. 4 surface). This numbering of the ply surfaces is in keeping with conventional practice. The first ply 12 is spaced from the second ply 18. In the non-limiting embodiment of FIG. 1, the first and second plies 12, 18 are spaced apart and bonded together by a conventional interlayer 24. Alternatively, as shown in FIG. 3, the first ply 12 and second ply 18 can form part of a conventional IGU 100 and can be spaced apart by a conventional spacer assembly 102. A gap 104 is formed between the plies 12, 18 that can be evacuated or filled with a selected gas, such as air or an inert gas.

As shown in FIG. 1, a first solar control/electromagnetic shielding coating 30 is formed over at least a portion of one of the plies 12, 18, such as but not limited to over at least a portion of the No. 1 surface 14 or the No. 2 surface 16. A second solar control/electromagnetic shielding coating 32 is formed over at least a portion of one or more of the other surfaces, such as over at least a portion of the No. 3 surface 20 or the No. 4 surface 22. In the illustrated non-limiting embodiment, the first coating 30 is formed over at least a portion of the No. 2 surface 16 and the second coating 32 is formed over at least a portion of the No. 3 surface 20.

In the broad practice of the invention, the plies 12, 18 of the device 10 can be of the same or different materials. The plies 12, 18 can include any desired material having any desired characteristics. For example, one or more of the plies 12, 18 can be transparent or translucent to visible light. By "transparent" is meant having visible light transmission of greater than 0% to 100%. Alternatively, one or more of the plies 12, 18 can be translucent. By "translucent" is meant allowing electromagnetic energy (e.g., visible light) to pass through but diffusing this energy such that objects on the side opposite the viewer are not clearly visible. Examples of suitable materials include, but are not limited to, plastic substrates (such as acrylic polymers, such as polyacrylates; polyalkylmethacrylates, such as polymethylmethacrylates, polyethylmethacrylates, polypropylmethacrylates, and the like; polyurethanes; polycarbonates; polyalkylterephthalates, such as polyethyleneterephthalate (PET), polypropyleneterephthalates, polybutyleneterephthalates, and the like; polysiloxane-containing polymers; or copolymers of any monomers for preparing these, or any mixtures thereof); ceramic substrates; glass substrates; or mixtures or combinations of any of the above. For example, one or more of the plies 12, 18 can include conventional soda-lime-silicate glass, borosilicate glass, or leaded glass. The glass can be clear glass. By "clear glass" is meant non-tinted or non-colored glass. Alternatively, the glass can be tinted or otherwise colored glass. The glass can be annealed or heat-treated glass. As used herein, the term "heat treated" means tempered or at least partially tempered. The glass can be of any type, such as conventional float glass, and can be of any composition having any optical properties, e.g., any value of visible transmission, ultraviolet transmission, infrared transmission, and/or total solar energy transmission. By "float glass" is meant glass formed by a conventional float process in which molten glass is deposited onto a molten metal bath and controllably cooled to form a float glass ribbon. The first and second plies 12, 18 can each be, for example, clear float glass or can be tinted or colored glass or one ply 12, 18 can be clear glass and the other ply 12, 18 colored glass. Although not limiting to the invention, examples of glass suitable for the first ply 12 and/or second ply 18 are described in U.S. Pat. Nos. 4,746,347; 4,792,536; 5,030,593; 5,030,594; 5,240,886; 5,385,872; and 5,393,593. The first and second plies 12, 18 can be of any desired dimensions, e.g., length, width, shape, or thickness. In one exemplary embodiment, the first and second plies can each be 1 mm to 20 mm thick, such as 1 mm to 15 mm thick, such as 3 mm to 10 mm, such as 4 mm to 8 mm, such as 6 mm thick.

In one non-limiting embodiment, one or both of the plies 12, 18 can have a high visible light transmission at a reference wavelength of 550 nanometers (nm). By "high visible light transmission" is meant visible light transmission at 550 nm of greater than or equal to 85%, such as greater than or equal to 87%, such as greater than or equal to 90%, such as greater than or equal to 91%, such as greater than or equal to 92%. Particularly useful glass for the practice of the invention is disclosed in U.S. Pat. Nos. 5,030,593 and 5,030,594 and is commercially available from PPG Industries, Inc. under the mark Starphire®.

In another non-limiting embodiment, one ply can comprise a material having a higher visible light transmission than the other ply at equal thicknesses. For example, in one non-limiting embodiment, the first ply 12 comprises a high visible light transmission glass of the type described above and the second ply 18 comprises clear or colored glass having a lower visible light transmission than the first ply 12. For example and without limiting the present invention, the first ply 12 can have a visible light transmission at 550 nm greater than or equal to 90%, such as greater than or equal to 91%, such as greater than or equal to 92%. The second ply 18 can have a visible light transmission at 550 nm up to 90%, such as up to 85%, such as up to 80%, such as up to 70%, such as up to 60%, such as up to 50%, such as up to 30%, such as up to 20%. Non-limiting examples of glass that can be used for the practice of the invention, e.g., for the second ply, include Solargreen®, Solextra®, GL-20®, GL-35™, Solarbronze®, and Solargray® glass, all commercially available from PPG Industries Inc. of Pittsburgh, Pa. In one particular non-limiting embodiment, the first ply 12 comprises Starphire® glass (commercially available from PPG Industries, Inc.) having a thickness in the range of 1 mm to 10 mm, such as 1.7 mm to 2.5 mm, e.g., 2.1 mm and the second ply comprises GL20® glass having a thickness in the range of 1 mm to 10 mm, such as 1.7 mm to 2.5 mm, e.g., 2.1 mm. In a further non-limiting embodiment, one or both of the plies 12, 18 can be annealed glass.

The interlayer 24 can be of any desired material and can include one or more layers or plies. The interlayer 24 can be a polymeric or plastic material, such as, for example, polyvinylbutyral, plasticized polyvinyl chloride, or multi-layered thermoplastic materials including polyethyleneterephthalate, etc. Suitable interlayer materials are disclosed, for example but not to be considered as limiting, in U.S. Pat. Nos. 4,287,107 and 3,762,988. The interlayer 24 secures the first and second plies 12, 18 together, can provide energy absorption, can reduce noise, and can increase the strength of the laminated structure. The interlayer 24 can also be a sound-absorbing or attenuating material as described, for example, in U.S. Pat. No. 5,796,055. The interlayer 24 can have a solar control coating provided thereon or incorporated therein or can include a colored material to reduce solar energy transmission and/or to provide a color to the device 10. In one non-limiting embodiment, the interlayer 24 is polyvinylbutyral and has a thickness in the range of 0.5 mm to 1.5 mm, such as 0.75 mm to 0.8 mm.

The coatings 30 and 32 can be the same or different. The coatings 30, 32 provide the device 10 with both solar control and electromagnetic shielding properties. By "solar control" is meant a coating comprised of one or more layers or films that affect the solar properties of the coated article, such as but not limited to the amount of solar radiation, for example, visible, infrared, or ultraviolet radiation, reflected from, absorbed by, or passing through the coated article; shading coefficient; emissivity; etc. A solar control coating can block, absorb or filter selected portions of the solar spectrum, such as but not limited to the infrared (IR), ultraviolet (UV), and/or visible spectrums. By "electromagnetic shielding" is meant a coating that prevents or reduces the passage of electromagnetic radiation, such as one or more selected wavelengths of radiation, through the coated article. The coating can block, absorb or filter selected portions of the electromagnetic spectrum. Examples of coatings that can be used in the practice of the invention are found, for example but not to be considered as limiting, in U.S. Pat. Nos. 4,898,789; 5,821,001; 4,716,086; 4,610,771; 4,902,580; 4,716,086; 4,806,220; 4,898,790; 4,834,857; 4,948,677; 5,059,295; and 5,028,759, and also in U.S. patent application Ser. No. 09/058,440.

An exemplary coating 30 will now be described. It will be understood that the second coating 32 can be the same as the first coating 30. In one non-limiting embodiment, the coating 30 can include one or more metallic films positioned between pairs of dielectric layers applied sequentially over at least a portion of one of the glass plies 12, 18. The coating 30 can be a heat and/or radiation reflecting coating and can have one or more coating layers or films of the same or different composition and/or functionality. As used herein, the term "film" refers to a coating region of a desired or selected coating composition. A "layer" can comprise one or more "films" and a "coating" or "coating stack" can comprise one or more "layers". For example, the coating 30 can be a single layer coating or a multi-layer coating and can include one or more metals, non-metals, semi-metals, semiconductors, and/or alloys, compounds, compositions, combinations, or blends thereof. For example, the coating 30 can be a single layer metal oxide coating, a multiple layer metal oxide coating, a non-metal oxide coating, a metallic nitride or oxynitride coating, a non-metallic nitride or oxynitride coating, or a multiple layer coating comprising one or more of any of the above materials. In one non-limiting embodiment, the coating 30 can be a doped metal oxide coating.

The coating 30 can be a functional coating. As used herein, the term "functional coating" refers to a coating that modifies one or more physical properties of the substrate over which it is deposited, e.g., optical, thermal, chemical or mechanical properties, and is not intended to be entirely removed from the substrate during subsequent processing. The coating 30 can have one or more functional coating layers or films of the same or different composition or functionality.

The coating 30 can also be an electroconductive low emissivity coating that allows visible wavelength energy to be transmitted through the coating but reflects longer wavelength solar infrared energy. By "low emissivity" is meant emissivity less than 0.4, such as less than 0.3, such as less than 0.2, such as less than 0.1, e.g., less than or equal to 0.05. Examples of low emissivity coatings are found, for example, in U.S. Pat. Nos. 4,952,423 and 4,504,109 and British reference GB 2,302,102.

Non-limiting examples of suitable coatings 30 for use with the invention are commercially available from PPG Industries, Inc. of Pittsburgh, Pa. under the SUNGATE® and SOLARBAN® families of coatings. Such coatings typically include one or more anti-reflective coating films comprising dielectric or anti-reflective materials, such as metal oxides or oxides of metal alloys, which are transparent to visible light. The coating 30 can also include one or more infrared reflective films comprising a reflective metal, e.g., a noble metal such as gold, copper or silver, or combinations or alloys thereof, and can further comprise a primer film or barrier film, such as titanium, as is known in the art, located over and/or under the metal reflective layer. The coating 30 can have any desired number of infrared reflective films, such as but not limited to 1 to 7 infrared reflective films. In one non-limiting embodiment, the coating 30 can have 1 or more silver layers, e.g., 2 or more silver layers, e.g., 3 or more silver layers, such as 4 or more silver layers, such as 5 or more silver layers, such as 6 or more silver layers. The coatings 30, 32 can have the same or different number of infrared reflective films and the corresponding infrared reflective films of the coatings 30, 32 can have the same or different thicknesses. A non-limiting example of a suitable coating having three silver layers is disclosed in U.S. patent application Ser. No. 10/364,089 (U.S. Publication No. 2003/0180547 A1).

The coating 30 can be deposited by any conventional method, such as but not limited to conventional chemical vapor deposition (CVD) and/or physical vapor deposition (PVD) methods. Examples of CVD processes include spray pyrolysis. Examples of PVD processes include electron beam evaporation and vacuum sputtering (such as magnetron sputter vapor deposition (MSVD)). Other coating methods could also be used, such as but not limited to sol-gel deposition. In one non-limiting embodiment, the coating 30 can be deposited by MSVD. Examples of MSVD coating devices and methods will be well understood by one of ordinary skill in the art and are described, for example, in U.S. Pat. Nos. 4,379,040; 4,861,669; 4,898,789; 4,898,790; 4,900,633; 4,920,006; 4,938,857; 5,328,768; and 5,492,750.

Figure 2:
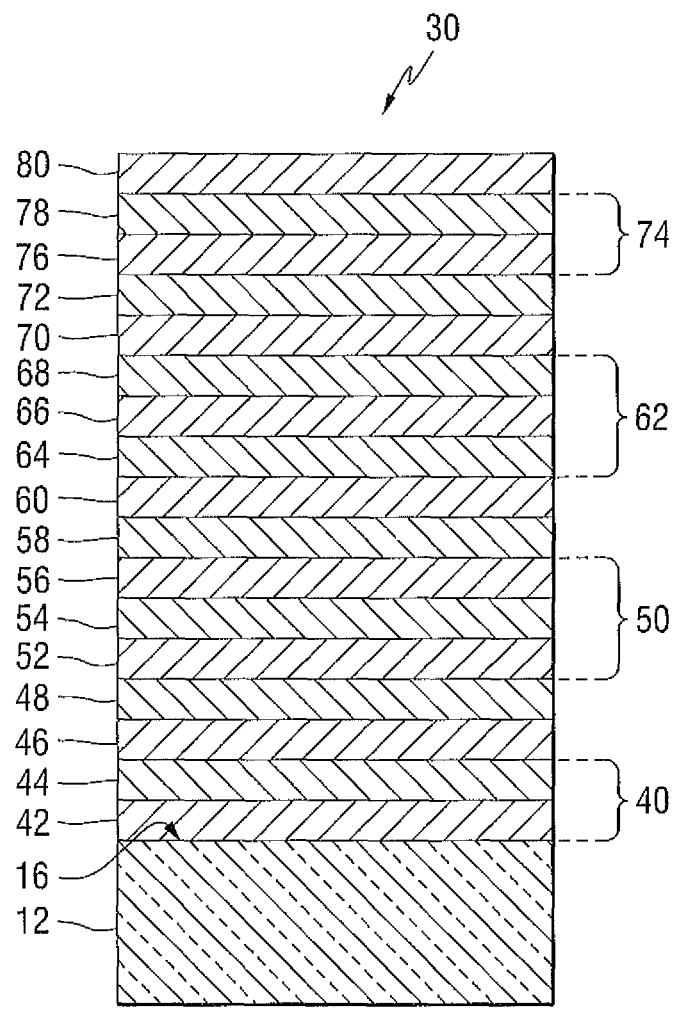
FIG. 2 is a cross-sectional view (not to scale) of a non-limiting coating suitable for the invention.

An exemplary non-limiting coating 30 suitable for the invention is shown in FIG. 2. This exemplary coating 30 includes a base layer or first dielectric layer 40 deposited over at least a portion of a major surface of a substrate (e.g., the No. 2 surface 16 of the first ply 12). The first dielectric layer 40 can comprise one or more films of anti-reflective materials and/or dielectric materials, such as but not limited to metal oxides, oxides of metal alloys, nitrides, oxynitrides, or mixtures thereof. The first dielectric layer 40 can be transparent to visible light. Examples of suitable metal oxides for the first dielectric layer 40 include oxides of titanium, hafnium, zirconium, niobium, zinc, bismuth, lead, indium, tin, and mixtures thereof. These metal oxides can have small amounts of other materials, such as manganese in bismuth oxide, tin in indium oxide, etc. Additionally, oxides of metal alloys or metal mixtures can be used, such as oxides containing zinc and tin (e.g., zinc stannate), oxides of indium-tin alloys, silicon nitrides, silicon aluminum nitrides, or aluminum nitrides. Further, doped metal oxides, such as antimony or indium doped tin oxides or nickel or boron doped silicon oxides, can be used. The first dielectric layer 40 can be a substantially single phase film, such as a metal alloy oxide film, e.g., zinc stannate, or can be a mixture of phases composed of zinc and tin oxides or can be composed of a plurality of metal oxide films, such as those disclosed in U.S. Pat. Nos. 5,821,001; 4,898,789; and 4,898,790.

In the illustrated exemplary embodiment shown in FIG. 2, the first dielectric layer 40 can comprise a multi-film structure having a first film 42, e.g., a metal alloy oxide film, deposited over at least a portion of the inner major surface 16 of the first ply 12 and a second film 44, e.g., a metal oxide or oxide mixture film, deposited over the first metal alloy oxide film 42. In one non-limiting embodiment, the first film 42 can be a zinc/tin alloy oxide. The zinc/tin alloy oxide can be that obtained from magnetron sputtering vacuum deposition from a cathode of zinc and tin that can comprise zinc and tin in proportions of 10 wt. % to 90 wt. % zinc and 90 wt. % to 10 wt. % tin. One suitable metal alloy oxide that can be present in the first film 42 is zinc stannate. By "zinc stannate" is meant a composition of $Zn_XSn_{1-X}O_{2-X}$ (Formula 1) where "x" varies in the range of greater than 0 to less than 1. For instance, "x" can be greater than 0 and can be any fraction or decimal between greater than 0 to less than 1. For example where x=⅔, Formula 1 is $Zn_{2/3}Sn_{1/3}O_{4/3}$, which is more commonly described as "$Zn_2SnO_4$". A zinc stannate-containing film has one or more of the forms of Formula 1 in a predominant amount in the film. In one non-limiting embodiment, the first film 42 comprises zinc stannate and has a thickness in the range of 100 Å to 500 Å, such as 150 Å to 400 Å, e.g., 200 Å to 300 Å, e.g., 260 Å.

The second film 44 can be a zinc-containing film, such as zinc oxide. The zinc oxide film can be deposited from a zinc cathode that includes other materials to improve the sputtering characteristics of the cathode. For example, the zinc cathode can include a small amount (e.g., less than 10 wt. %, such as greater than 0 to 5 wt. %) of a conductive material, such as tin, to improve sputtering. In which case, the resultant zinc oxide film would include a small percentage of tin oxide, e.g., 0 to less than 10 wt. % tin oxide, e.g., 0 to 5 wt. % tin oxide. An oxide layer sputtered from a zinc/tin cathode having ninety-five percent zinc and five percent tin is still referred to herein as a zinc oxide film. The small amount of tin in the cathode (e.g., less than 10 wt. %) is believed to form a small amount of tin oxide in the predominantly zinc oxide-containing second film 44. The second film 44 can have a thickness in the range of 50 Å to 200 Å, such as 75 Å to 150 Å, e.g., 100 Å. In one non-limiting embodiment in which the first film 42 is zinc stannate and the second film 44 is zinc oxide, the first dielectric layer 40 can have a total thickness of less than or equal to 1,000 Å, such as less than or equal to 500 Å, e.g., 300 Å to 450 Å, e.g., 350 Å to 425 Å, e.g., 400 Å.

A first heat and/or radiation reflective film or layer 46 can be deposited over the first dielectric layer 40. The first reflective layer 46 can include a reflective metal, such as but not limited to metallic gold, copper, silver, or mixtures, alloys, or combinations thereof. In one embodiment, the first reflective layer 46 comprises a metallic silver layer having a thickness in the range of 25 Å to 300 Å, e.g., 50 Å to 300 Å, e.g., 50 Å to 200 Å, such as 70 Å to 150 Å, such as 100 Å to 150 Å, e.g., 130 Å.

A first primer film 48 can be deposited over the first reflective layer 46. The first primer film 48 can be an oxygen-capturing material, such as titanium, that can be sacrificial during the deposition process to prevent degradation or oxidation of the first reflective layer 46 during the sputtering process or subsequent heating processes. The oxygen-capturing material can be chosen to oxidize before the material of the first reflective layer 46. If titanium is used as the first primer film 48, the titanium would preferentially oxidize to titanium dioxide during subsequent processing of the coating before oxidation of the underlying silver layer. In one embodiment, the first primer film 48 is titanium having a thickness in the range of 5 Å to 50 Å, e.g., 10 Å to 40 Å, e.g., 15 Å to 25 Å, e.g., 20 Å.

An optional second dielectric layer 50 can be deposited over the first reflective layer 46 (e.g., over the first primer film 48). The second dielectric layer 50 can comprise one or more metal oxide or metal alloy oxide-containing films, such as those described above with respect to the first dielectric layer. In the illustrated non-limiting embodiment, the second dielectric layer 50 includes a first metal oxide film 52, e.g., a zinc oxide film deposited over the first primer film 48. A second metal alloy oxide film 54, e.g., a zinc stannate ($Zn_2SnO_4$) film, can be deposited over the first zinc oxide film 52. A third metal oxide film 56, e.g., another zinc/tin oxide layer, can be deposited over the zinc stannate layer to form a multi-film second dielectric layer 50. In one non-limiting embodiment, the zinc oxide films 52, 56 of the second dielectric layer 50 can each have a thickness in the range of about 50 Å to 200 Å, e.g., 75 Å to 150 Å, e.g., 100 Å. The metal alloy oxide layer (zinc stannate) 54 can have a thickness in the range of 100 Å to 800 Å, e.g., 200 Å to 700 Å, e.g., 300 Å to 600 Å, e.g., 550 Å to 600 Å.

An optional second heat and/or radiation reflective layer 58 can be deposited over the second dielectric layer 50. The second reflective layer 58 can include any one or more of the reflective materials described above with respect to the first reflective layer 46. In one non-limiting embodiment, the second reflective layer 58 comprises silver having a thickness in the range of 25 Å to 200 Å, e.g., 50 Å to 150 Å, e.g., 80 Å to 150 Å, e.g., 100 Å to 150 Å, e.g., 130 Å. In another non-limiting embodiment, this second reflective layer 58 can be thicker than the first and/or third reflective layers (the third reflective layer to be discussed later).

An optional second primer film 60 can be deposited over the second reflective layer 58. The second primer film 60 can be any of the materials described above with respect to the first primer film 48. In one non-limiting embodiment, the second primer film includes titanium having a thickness in the range of about 5 Å to 50 Å, e.g., 10 Å to 25 Å, e.g., 15 Å to 25 Å, e.g., 20 Å.

An optional third dielectric layer 62 can be deposited over the second reflective layer 58 (e.g., over the second primer film 60). The third dielectric layer 62 can also include one or more metal oxide or metal alloy oxide-containing layers, such as discussed above with respect to the first and second dielectric layers 40, 50. In one non-limiting embodiment, the third dielectric layer 62 is a multi-film layer similar to the second dielectric layer 50. For example, the third dielectric layer 62 can include a first metal oxide layer 64, e.g., a zinc oxide layer, a second metal alloy oxide-containing layer 66, e.g., a zinc stannate layer ($Zn_2SnO_4$), deposited over the zinc oxide layer 64, and a third metal oxide layer 68, e.g., another zinc oxide layer, deposited over the zinc stannate layer 66. In one non-limiting embodiment, the zinc oxide layers 64, 68 can have thicknesses in the range of 50 Å to 200 Å, such as 75 Å to 150 Å, e.g., 100 Å. The metal alloy oxide layer 66 can have a thickness in the range of 100 Å to 800 Å, e.g., 200 Å to 700 Å, e.g., 300 Å to 600 Å, e.g., 550 Å to 600 Å.

In one non-limiting aspect of the invention, the second dielectric layer 50 and third dielectric layer 62 have thicknesses that are within 10% of each other, such as within 5%, such as within 3% of each other, such as within 2% of each other.

The coating 30 can further include an optional third heat and/or radiation reflective layer 70 deposited over the third dielectric layer 62. The third reflective layer 70 can be of any of the materials discussed above with respect to the first and second reflective layers. In one non-limiting embodiment, the third reflective layer 70 includes silver and has a thickness in the range of 25 Å to 300 Å, e.g., 50 Å to 300 Å, e.g., 50 Å to 200 Å, such as 70 Å to 150 Å, such as 100 Å to 150 Å, e.g., 120 Å. In one non-limiting aspect of the invention, the first reflective layer 46 and third reflective layer 70 have thicknesses that are within 10% of each other, such as within 5%, of each other, such as within 3% of each other, such as within 2% of each other.

An optional third primer film 72 can be deposited over the third reflective layer 70. The third primer film 72 can be of any of the primer materials described above with respect to the first or second primer films. In one non-limiting embodiment, the third primer film is titanium and has a thickness in the range of 5 Å to 50 Å, e.g., 10 Å to 25 Å, e.g., 20 Å.

An optional fourth dielectric layer 74 can be deposited over the third reflective layer (e.g., over the third primer film 72). The fourth dielectric layer 74 can be comprised of one or more metal oxide or metal alloy oxide-containing layers, such as those discussed above with respect to the first, second, or third dielectric layers 40, 50, 62. In one non-limiting embodiment, the fourth dielectric layer 74 is a multi-film layer having a first metal oxide layer 76, e.g., a zinc oxide layer, deposited over the third primer film 72, and a second metal alloy oxide layer 78, e.g., a zinc stannate layer ($Zn_2SnO_4$), deposited over the zinc oxide layer 76. The zinc oxide layer 76 can have a thickness in the range of 25 Å to 200 Å, such as 50 Å to 150 Å, such as 100 Å. The zinc stannate layer 78 can have a thickness in the range of 25 Å to 500 Å, e.g., 50 Å to 500 Å, e.g., 100 Å to 400 Å, e.g., 200 Å to 300 Å, e.g., 260 Å.

The coating 30 can contain any number of additional groups of dielectric layer/reflective metal layer/primer layer units as desired. In one particular non-limiting embodiment, the coating 30 can contain up to six anti-reflective metal layers, e.g., up to six silver layers, along with the associated dielectric layers.

The coating 30 can include a protective overcoat 80, which, for example in the non-limiting embodiment shown in FIG. 2, is deposited over the optional fourth dielectric layer 74 (if present), to assist in protecting the underlying layers, such as the anti-reflective layers, from mechanical and chemical attack during processing. The protective coating 80 can be an oxygen barrier coating layer to prevent or reduce the passage of ambient oxygen into the underlying layers of the coating 30 during subsequent processing, e.g., such as during heating or bending. The protective coating 80 can be of any desired material or mixture of materials. In one exemplary embodiment, the protective coating 80 can include a layer having one or more metal oxide materials, such as but not limited to oxides of aluminum, silicon, or mixtures thereof.

The protective coating 80 can be of any desired thickness. In one exemplary laminated article embodiment, the protective coating 80 can have a thickness in the range of 100 Å to 50,000 Å, such as 500 Å to 50,000 Å, e.g., 500 Å to 10,000 Å, such as 100 Å to 2,000 Å. Further, the protective coating 80 can be of non-uniform thickness. By "non-uniform thickness" is meant that the thickness of the protective coating 80 can vary over a given unit area, e.g., the protective coating 80 can have high and low spots or areas.

The protective coating 80 can be of any desired material or mixture of materials. In one exemplary embodiment, the protective coating 80 can include one or more metal oxide materials, such as but not limited to, aluminum oxide, silicon oxide, or mixtures thereof. For example, the protective coating 80 can be a single coating layer comprising in the range of 0 wt. % to 100 wt. % alumina and/or 0 wt. % to 100 wt. % silica, such as 5 wt. % to 100 wt. % alumina and 95 wt. % to 0 wt. % silica, such as 5 wt. % to 90 wt. % alumina and 95 wt. % to 10 wt. % silica, such as 10 wt. % to 90 wt. % alumina and 90 wt. % to 10 wt. % silica, such as 15 wt. % to 90 wt. % alumina and 85 wt. % to 10 wt. % silica, such as 50 wt. % to 70 wt. % alumina and 50 wt. % to 30 wt. % silica, such as 35 wt. % to 100 wt. % alumina and 65 wt. % to 0 wt. % silica, e.g., 70 wt. % to 90 wt. % alumina and 10 wt. % to 30 wt. % silica, e.g., 75 wt. % to 85 wt. % alumina and 15 wt. % to 25 wt. % of silica, e.g., 88 wt. % alumina and 12 wt. % silica, e.g., 65 wt. % to 75 wt. % alumina and 25 wt. % to 35 wt. % silica, e.g., 70 wt. % alumina and 30 wt. % silica. Other materials, such as aluminum, chromium, hafnium, yttrium, nickel, boron, phosphorous, titanium, zirconium, and/or oxides thereof, can also be present.

Alternatively, the protective coating 80 can be a multilayer coating formed by separately formed layers of metal oxide materials, such as but not limited to a bilayer formed by one metal oxide containing layer (e.g., an alumina layer or a silica and alumina containing first layer) and another metal oxide containing layer (e.g., a silica layer or a silica and alumina containing second layer). The individual layers of the multilayer protective coating 80 can be of any desired thickness.

In one embodiment, the protective coating 80 can comprise a first layer and a second layer formed over the first layer. In one non-limiting embodiment, the first layer can comprise alumina, or a mixture or alloy comprising alumina and silica. For example, the first layer can comprise a silica/alumina mixture having at least 5 wt. % alumina, such as at least 10 wt. % alumina, such as at least 15 wt. % alumina, such as at least 30 wt. % alumina, such as at least 40 wt. % alumina, such as at least 60 wt. % alumina, such as at least 70 wt. % alumina, such as at least 80 wt. % alumina, such as at least 90 wt. % alumina, such as at least 95 wt. % alumina, such as 50 wt. % to 70 wt. % alumina, such as in the range of 70 wt. % to 100 wt. % alumina and 30 wt. % to 0 wt. % silica, such as in the range of 60 wt. % to 100 wt. % alumina and 40 wt. % to 0 wt. % silica. In one non-limiting embodiment, the first layer can have a thickness in the range of greater than 0 Å to 1 micron, such as 50 Å to 100 Å, such as 100 Å to 250 Å, such as 100 Å to 200 Å, such as 100 Å to 150 Å, such as greater than 100 Å to 125 Å.

The second layer can comprise silica, or a mixture or alloy comprising silica and alumina. For example, the second layer can comprise a silica/alumina mixture having at least 40 wt. % silica, such as at least 50 wt. % silica, such as at least 60 wt. % silica, such as at least 70 wt. % silica, such as at least 80 wt. % silica, such as at least 85 wt. % silica, such as at least 90 wt. % silica, such as at least 95 wt. % silica, such as in the range of 80 wt. % to 90 wt. % silica and 10 wt. % to 20 wt. % alumina, e.g., 85 wt. % silica and 15 wt. % alumina. In one non-limiting embodiment, the second layer can have a thickness in the range of greater than 0 Å to 2 microns, such as 50 Å to 5,000 Å, such as 50 Å to 2,000 Å, such as 100 Å to 1,000 Å, such as 300 Å to 500 Å, such as 350 Å to 400 Å.

The second coating 32 can be the same as or substantially the same as the first coating 30 described above.

It is estimated that the above described laminated device 10 would transmit less than 1% of the infrared radiation between 800 nm and 2,300 nm. It is also estimated that radio frequency attenuation would be at least 20 dB between 800 MHz and 3 GHz. It is further estimated that the radio frequency attenuation would be at least 20 dB over the 50 MHz to 20 GHz range.

It will be readily appreciated by those skilled in the art that modifications may be made to the invention without departing from the concepts disclosed in the foregoing description. Moreover, as will be appreciated by one of ordinary skill in the art, the preferred parameters described above can be adjusted, if required, for different substrate materials and/or thicknesses. Accordingly, the particular embodiments described in detail herein are illustrative only and are not limiting to the scope of the invention, which is to be given the full breadth of the appended claims and any and all equivalents thereof.

What is claimed is:
1. A transparent electromagnetic radiation shielding device to prevent passage of electromagnetic radiation from electronic equipment, consisting of:
   a first glass ply having a No. 1 surface and a No. 2 surface;
   a second glass ply spaced from the first ply and having a No. 3 surface and a No. 4 surface, wherein the No. 2 surface of the first ply faces the No. 3 surface of the second ply;
   a first coating stack formed over the first ply, the first coating stack consisting of a first coating, a first protective layer formed over the first coating, and a first optional dielectric layer residing abuttingly between the first protective layer and the first coating, wherein the first coating is provided over at least a portion of the No. 2 surface; and
   a second coating stack formed over the second ply, the second coating stack consisting of a second coating, a second protective layer formed over the second coating, and a second optional dielectric layer residing abuttingly between the second protective layer and the second coating, wherein the second coating is provided over at least a portion of the No. 3 surface; and
   a polymeric interlayer bonding the first ply and the second ply;
   wherein, the first coating has at least three metallic layers formed over at least a portion of the first ply, wherein each metallic layer of the first coating resides within a first coating layer unit, each first coating layer unit including, in order away from the first ply a dielectric layer, a metallic layer, and a primer layer, wherein the metallic layer is positioned abuttingly between the dielectric layer and the primer layer, wherein each dielectric layer of each first coating layer unit consists of one or more metal oxides, one or more metal alloy oxides, or mixtures thereof, and each primer layer of each first coating layer unit consists of titanium and optionally titanium dioxide, provided that the dielectric layer of each first coating layer unit provides a film consisting of zinc oxide facing the metallic layer;
   the second coating has at least three metallic layers formed over at least a portion of the second ply, wherein each metallic layer of the second coating resides within a second coating layer unit, each second coating layer unit including, in order away from the second ply, a dielectric layer, a metallic layer, and a primer layer, wherein the metallic layer is positioned abuttingly between the dielectric layer and the primer layer, wherein each dielectric layer of each second coating layer unit consists of one or more metal oxides, one or more metal alloy oxides, or mixtures thereof, and each primer layer of each second coating layer unit consists of titanium and optionally titanium dioxide, provided that the dielectric layer of each second coating layer unit provides a film consisting of zinc oxide that faces the metallic layer;
   the first protective layer and the second protective layer each consisting of a mixture of aluminum oxide and silicon oxide having at least 80 wt. % silicon oxide; and
   the first optional dielectric layer and the second optional dielectric layer each independently consist of one or more metal oxides, one or more metal alloy oxides, or mixtures thereof, and
   wherein the device provides a radio frequency attenuation of at least 20 dB between 800 MHz and 3 GHz.

2. The device of claim 1, wherein each of the metallic layers in the first and second coatings comprise metallic silver.

3. The device of claim 1, wherein at least one of the first and second coatings includes at least four metallic silver layers.

4. The device of claim 1, wherein at least one of the first and second coatings includes at least five metallic silver layers.

5. The device of claim 1, wherein at least one of the first and second coatings includes at least six metallic silver layers.

6. An electromagnetic radiation shielding device to prevent passage of electromagnetic radiation from electronic equipment, comprising:
 a first glass ply having a No. 1 surface and a No. 2 surface;
 a second glass ply spaced from the first ply and having a No. 3 surface and a No. 4 surface, with the No. 2 surface facing the No. 3 surface;
 a first coating stack formed over the first ply, the first coating stack consisting of a first coating, a first protective layer formed over the first coating, and a first optional dielectric layer residing abuttingly between the first protective layer and the first coating; and
 a second coating stack formed over the second ply, the second coating stack consisting of a second coating, a second protective layer formed over the second coating, and a second optional dielectric layer residing abuttingly between the second protective layer and the second coating; and
 means for connecting the first ply and the second ply, the means for connecting selected from the group consisting of an interlayer bonding the first ply and the second ply and a spacer assembly separating the first ply and the second ply,
 wherein, the first coating is formed over at least a portion of the No. 2 surface and has at least three metallic layers, wherein each metallic layer of the first coating resides within a first coating layer unit, each first coating layer unit including, in order away from the first ply a dielectric layer, a metallic layer, and a primer layer, wherein the metallic layer is positioned abuttingly between the dielectric layer and the primer layer, wherein each dielectric layer of each first coating layer unit consists of one or more metal oxides, one or more metal alloy oxides, or mixtures thereof, and each primer layer of each first coating layer unit consists of titanium and optionally titanium dioxide, provided that the dielectric layer of each first coating layer unit provides a film consisting of zinc oxide that faces the metallic layer;
 the second coating is formed over at least a portion of the No. 3 surface and has three metallic layers, wherein each metallic layer of the second coating resides within a second coating layer unit, each second coating layer unit including, in order away from the second ply, a dielectric layer, a metallic layer, and a primer layer, wherein the metallic layer is positioned abuttingly between the dielectric layer and the primer layer, wherein each dielectric layer of each second coating layer unit consists of one or more metal oxides, one or more metal alloy oxides, or mixtures thereof, and each primer layer of each second coating layer unit consists of titanium and optionally titanium dioxide, provided that the dielectric layer of each second coating layer unit provides a film consisting of zinc oxide that faces the metallic layer;
 the first protective layer and the second protective layer each consisting of a mixture of aluminum oxide and silicon oxide having at least 80 wt. % silicon oxide; and
 the first optional dielectric layer and the second optional dielectric layer each independently consist of one or more metal oxides, one or more metal alloy oxides, or mixtures thereof, and
 wherein the device provides a radio frequency attenuation of at least 20 dB between 800 MHz and 3 GHz.

7. The device of claim 6, wherein each of the metallic layers in the first and second coatings comprise metallic silver.

8. The device of claim 6, wherein the first and second plies are located in the spacer assembly.

9. The device of claim 6, wherein at least one of the first and second coatings includes at least four metallic silver layers.

10. The device of claim 6, wherein at least one of the first and second coatings includes at least five metallic silver layers.

11. The device of claim 6, wherein at least one of the first and second coatings includes at least six metallic silver layers.

12. A method of attenuating electromagnetic radiation from electronic equipment, consisting of:
 providing a first glass ply having a No. 1 surface and a No. 2 surface;
 forming over at least a portion of the No. 2 surface a first coating stack consisting of a first coating, a first protective layer formed over the first coating, and a first optional dielectric layer residing abuttingly between the first protective layer and the first coating, wherein the first coating has at least three metallic silver layers, wherein each metallic layer of the first coating resides within a first coating layer unit including, in order away from the first ply a dielectric layer, a metallic layer, and a primer layer, wherein the metallic layer is positioned abuttingly between the dielectric layer and the primer layer, wherein each dielectric layer of each first coating layer unit consists of one or more metal oxides, one or more metal alloy oxides, or mixtures thereof, and each primer layer of each first coating layer unit consists of titanium and optionally titanium dioxide, provided that the dielectric layer of each first coating layer unit provides a film consisting of zinc oxide that faces the metallic layer;
 providing a second glass ply spaced from the first ply and having a No. 3 surface and a No. 4 surface, with the No. 3 surface facing the No. 2 surface;
 forming over at least a portion of the No. 3 surface a second coating stack consisting of a second coating, a second protective layer formed over the second coating, and a second optional dielectric layer residing abuttingly between the second protective layer and the second coating, wherein the second coating has at least three metallic silver layers, wherein each metallic layer of the second coating resides within a second coating layer unit including, in order away from the second ply, a dielectric layer, a metallic layer, and a primer layer, wherein the metallic layer is positioned abuttingly between the dielectric layer and the primer layer, wherein each dielectric layer of each second coating layer unit consists of one or more metal oxides, one or more metal alloy oxides, or mixtures thereof, and each primer layer of each second coating layer unit consists of titanium and optionally titanium dioxide, provided that the dielectric layer of each second coating layer unit provides a film consisting of zinc oxide that faces the metallic layer; and
 connecting the first ply and the second ply by a method selected from the group consisting of forming a polymeric interlayer bonding the first ply and the second ply and placing the first ply and the second ply in a spacer assembly, wherein the first protective layer and the second protective layer each consist of a mixture of aluminum oxide and silicon oxide having at least 80 wt. % silicon oxide, wherein the first optional dielectric layer and the second optional dielectric layer each independently consist of one or more metal oxides, one or more metal alloy oxides, or mixtures thereof, and wherein electromagnetic radiation directed at the device is attenuated by the first and second coatings, with the device providing a radio frequency attenuation of at least 20 dB between 800 MHz and 3 GHz.

13. The method of claim 12, wherein the polymeric interlayer is formed between the first ply and the second ply.

14. The method of claim 12, wherein the first ply and the second ply are placed in the spacer assembly.

15. The method of claim 12, wherein at least one of the first and second coatings includes at least four metallic silver layers.

16. The method of claim 12, wherein at least one of the first and second coatings includes at least five metallic silver layers.

* * * * *